(12) United States Patent
Hsiao

(10) Patent No.: US 7,133,338 B2
(45) Date of Patent: Nov. 7, 2006

(54) METHOD AND RELATED APPARATUS FOR EVALUATING BETA-PARAMETER ACCORDING TO RESULTS OF READ DATA SLICED WITH DIFFERENT SLICING LEVELS WHILE PERFORMING OPTIMAL POWER CONTROL OF OPTICAL DISK DRIVE

(75) Inventor: Yuan-Kun Hsiao, Taipei Hsien (TW)

(73) Assignee: VIA Optical Solution, Inc., Hsin-Tien (TW)

( * ) Notice: Subject to any disclaimer, the term of this patent is extended or adjusted under 35 U.S.C. 154(b) by 443 days.

(21) Appl. No.: 10/709,032

(22) Filed: Apr. 8, 2004

(65) Prior Publication Data

US 2005/0018549 A1 Jan. 27, 2005

Related U.S. Application Data

(60) Provisional application No. 60/461,578, filed on Apr. 10, 2003.

(51) Int. Cl.
*G11B 5/09* (2006.01)
*G11B 7/00* (2006.01)

(52) U.S. Cl. .................. 369/47.53; 369/47.5; 369/59.1

(58) Field of Classification Search ...................... None
See application file for complete search history.

(56) References Cited

U.S. PATENT DOCUMENTS

| 5,475,666 | A | * | 12/1995 | Ito et al. .................. 369/47.52 |
| 6,333,902 | B1 | | 12/2001 | Shim |
| 6,345,023 | B1 | | 2/2002 | Fushimi et al. |
| 6,661,752 | B1 | | 12/2003 | Eom |
| 6,891,785 | B1 | | 5/2005 | Yamamoto et al. |
| 7,053,919 | B1 | * | 5/2006 | Nagano .................... 369/47.53 |
| 2003/0043714 | A1 | * | 3/2003 | Takeda .................... 369/47.53 |

FOREIGN PATENT DOCUMENTS

| CN | 1373474 A | 10/2002 |
| JP | 11-353688 | 12/1999 |

\* cited by examiner

*Primary Examiner*—Muhammad Edun
(74) *Attorney, Agent, or Firm*—Winston Hsu

(57) ABSTRACT

A method and the related apparatus for performing optimal power control of an optical disk drive includes reading a write-in data from an optical disk and generating a corresponding read result after the write-in data is written onto the optical disk with the default power, and accumulating a beta parameter according to a portion of the filtered read result whose level is higher than a first level and lower than a second level. The first level is substantially higher than the second level.

19 Claims, 8 Drawing Sheets

METHOD AND RELATED APPARATUS FOR EVALUATING BETA-PARAMETER ACCORDING TO RESULTS OF READ DATA SLICED WITH DIFFERENT SLICING LEVELS WHILE PERFORMING OPTIMAL POWER CONTROL OF OPTICAL DISK DRIVE

BACKGROUND OF INVENTION

1. Field of the Invention

The present invention relates to a method and related apparatus for performing optimal power control in an optical disc drive, and more particularly, to a method and related apparatus for evaluating a beta-parameter according to sliced signals of read results in different levels.

2. Description of the Prior Art

In modern information society, small, light, high-density, and low-cost optical disks have become one of the most popular non-volatile storage devices. With development of CD-R drives, Compact Disk Recordable drives, users can store personal data in an optical disk with an optical disk drive. Since technologies for writing (burning) data into an optical disk need high precision and high accuracy, developmental issues of information technologies have focused on how to store data with an optimal write-in power.

In general, when writing data into an optical disk, a CD-R drive emits laser beams with a specific power into the optical disk, so as to bring about specific physical or chemical reactions for the optical disk to form a plurality of pits and lands. Owing to different reflection coefficients of the pits and the lands corresponding to a laser beam, an optical disk drive can read data stored in the optical disk by detecting reflection intensity of the pits and the lands with proper power laser beams emitting into the optical disk. However, optical disks from different manufacturers have different physical/chemical characters, also optical disk drives with different brands and models have different laser emitters, rotational speeds, etc. Therefore, with which power writing into the optical disk for forming proper pits and lands is a key point when writing into the optical disk.

In order to choose a preferred write-in power, the optical disk drive performs optimal power control before writing data into the optical disk. When performing optimal power control, the optical disk drive writes a default write-in data into the optical disk with different write-in powers, and then reads the write-in data from the optical disk, so as to determine whether the write-in power is an optimal power. Please refer to FIG. 1, which illustrates a waveform-time diagram of a write-in data 10 and two possible corresponding read results 12A, 12B when performing optimal power control, where X-axis is time scale, and Y-axis is waveform amplitude. The read result 12A is a result when writing the write-in data 10 into the optical disk with a preferred write-in power, while the read result 12B is a result when writing with an improper power.

As those skilled in the art recognized, digital data is properly coded before being written into the optical disk. Generally, in protocols of CD-R/RW, Compact Disk Recordable/ReWriteable, or DVD-R/RW, DVD+R/RW, Digital Versatile Disk R/RW, specific streams of coded data include bits with the same contents. For example, in protocols of CD-R/RW, a stream of the coded data includes at most 11 bits with the same contents, but at least 3 bits with the same contents, while in protocol of DVD, a stream of the coded data includes at most 14 bits with the same contents. Owing to different bit numbers of different streams, a write-in data should include streams with different bit numbers for simulating data writing with different write-in powers.

In FIG. 1, the write-in data 10 includes streams with different bit numbers. For example, a stream 14A includes 3 digital "0" between time points ta0 and ta1, where continues with a 3T duration Ta, and T is a bit duration. Also, a stream 14B with the duration Ta includes 3 "1" between time points ta1 and ta2. Besides, a stream 16A includes 14 "0" between time points ta5 and ta6, where continues with a 14T duration Tb, while a stream 16B with the duration Tb includes 14 "1" between time points ta4 and ta5.

Because of different reflection coefficients corresponding to a laser beam, the pits and the lands of the optical disk can properly represent "0" and "1". Therefore, when reading data corresponding to the read result from the optical disk, the optical disk drive compares the read result with a zero level. When writing data with a preferred write-in power, the read signal should be the read result 12A. For example, the write-in data 10 changes data status (which means: contents of the data change from "0" to "1", or vice versa) at time points ta1, ta2, ta3, ta4, ta5, ta6, and ta7, while the read result 12A corresponding to the time points responses to zero-crossings (which means: a signal level changes from a level greater than a zero level L0 to a level smaller than the zero level L0, or vice versa). In other words, the read result 12A can be decoded as "1" streams during a duration Ta from time points ta2 to ta3, a duration Tb from time points ta4 to ta5, and a duration Ta from ta6 to ta7, where the level of the read result 12A are greater than the zero level L0. Also, the read result 12A can be decoded as "0" streams during a duration Ta from time points ta1 to ta2, a duration Ta from time points ta3 to ta4, and a duration Tb from ta5 to ta6, where the level of the read result 12A are smaller than the zero level L0.

However, if the write-in power deviates from an ideal power, the read signal should be the read result 12B in FIG. 1 because the optical disk drive cannot form pits and lands with proper lengths. In this case, the read result 12B cannot represent original data in that the read result 12B crosses the zero level L0 at time points tb1, tb2, tb3, tb4, tb5, tb6, and tb7, which can not respond to the write-in data 10 from time points ta1 to ta7 when changing data status. For example, a duration of the read result 12B between time points tb1 and tb2, which is smaller than the zero level L0, is smaller than a duration between time points tb2 and tb3, which is greater than the zero level L0. But, in practical, the two durations of the read result 12B corresponds to the streams 14A and 14B with the same lengths. Therefore, when the write-in power deviates from the ideal power, the read result 12B cannot represent that the durations corresponding to the streams 14A and 14B of the write-in data 10 are the same.

Besides, in FIG. 1, lengths of the streams affect the read result corresponding to the streams. For example, provided that a optical disk drive writes a "0" stream into an optical disk with laser beams comprising larger power to form pits. When the optical disk drive writes a longer "0" stream into the optical disk, laser beams with larger power keep a longer duration and form deeper pits consequently. Relatively, when writing a shorter "0" stream, the laser beams keep a shorter duration and form shallower pits. Owing to different deepnesses comprising different reflect coefficients corresponding to a laser beam, when reading the "0" streams with different lengths, portions of the read result corresponding to the "0" streams have different signal values.

For example, in FIG. 1, because the "0" stream 16A between time points ta5 and ta6 is longer than the "0" stream 14A between time points ta1 and ta2, a portion of the optical disk corresponding to the stream 16A reflects weaker laser beams with deeper pits. Even if both the streams 14A and 16A represent "0", the signal level of the read result 12A between time point ta5 and ta6 is lower than that between time points tb1 and ta2. As FIG. 1 illustrates, the lowest levels of the read result 12A between time point ta5 and ta6 and between time points ta1 and ta2 are levels Ln1 and Ln0 respectively, wherein the level Ln1 is lower than the level Ln1. Similarly, as to the "1" streams 14B and 16B, the signal level of the read result 12A corresponding to the longer stream 16B can reach a level Lp1 between time points ta4 and ta5, while the signal level of the read result 12A corresponding to the stream 14B reaches a lower level Lp0 between time points ta1 and ta2.

The write-in power also affects waveform of the read result. The absolute value of the lowest level Ln0 of the read result 12A between time points ta1 and ta2 is equal to the absolute value of the highest level Lp0 of the read result 12A between time points ta2 and ta3, which means that the stream 14A of the write-in data 10 between time points ta1 and ta2 has the same length (or bit number) as the stream 14B between time points ta2 and ta3 has. Similarly, the absolute value of the highest level Lp1 of the read result 12A between time points ta4 and ta5 is equal to the absolute value of the lowest level Ln 1 between time points ta2 and ta3, which means that the streams 16B and 16A have the same lengths (or bit numbers)

In contrast, in real case as the read result 12B shows, the waveform is not so symmetric as the ideal read result 12A shows. For example, the read result 12B comprises a lowest level Ln3 between time points tb1 and tb2 corresponding to the stream 14A, and a highest level Lp3 between time points tb2 and tb3. However, the absolute value of the level Lp3 is larger than the absolute value of the level Ln3; that is, the read result 12B cannot represent the equal length of the streams 14A and 14B. Also, the absolute value of the highest level Lp2 of the read result 12B corresponding to the stream 16B between time points tb4 and tb5 is unequal to the absolute value of the lowest level Ln2 corresponding to the stream 16A between time points tb4 and tb5.

In summary, after writing the write-in data into the optical disk with an ideal power, each portion of the read result corresponding to the streams with the same lengths should have same durations during two zero-crossing time points and have same amplitude. On the other hand, if the write-power deviates from the ideal power, pits and lands with incorrect lengths cannot represent streams with different lengths and contents. Furthermore, even if streams have the same length, the corresponding read signals do not keep the same duration and amplitude. In other words, according to durations of zero-crossings and amplitudes of the read result, the optical disk drive determines whether the write-in data is written into the optical disk with a preferred write-in power. In general, a prior art optical drive with burn function sets a beta-parameter for responding to the read result quantitatively. When performing optimal power control, the optical disk drive writes with different write-in powers, calculates beta-parameters corresponding to the read result with the write-in powers, and then compares each beta-parameter. Therefore, the optical disk drive chooses a preferred power approximating to the ideal power from these write-in powers.

Please refer to FIG. 2, which illustrates a schematic diagram of a prior art optical disk drive 20 when performing optimal power control. The optical disk drive 20 includes a motor 22, a pick-up head 24, an access circuit 28, and a control module 30. The optical disk drive 20 further includes a peak hold circuit 32A, a bottom hold circuit 32B, and an analog to digital converter 34 for performing optimal power control. The motor 22 rotates an optical disk 26. The pick-up head 24 emits laser beams into the optical disk 26 and receives reflections for data access. The control module 30 controls operations of the optical disk drive 20. The access circuit 28 drives the pick-up head 24 to write coded data into the optical disk 26 under control of the control module 30. The pick-up head 24 transmits signals corresponding to the reflections through the access circuit 28 to the control module 30 after receiving the reflections from the optical disk 26. The peak hold circuit 32A generates an output signal after receiving an input signal and makes the output signal track to peaks of the input signal, while the bottom hold circuit 32B makes its output signal track to bottoms of its input signal. The converter 34 converts analog signals to digital signals under control of the control module 30.

When the optical disc drive 20 performing optimal power control, the access circuit 28 transmits the write-in data to the pick-up head 24, and the pick-up head 24 writes the write-in data into the optical disk 26 with a default write-in power. Then, the pick-up head 24 reads the written data from the optical disk 26, and transmits a read result 36 through the access circuit 28 to the peak and the bottom hold circuits 32A and 32B. The peak hold circuit 32A tracks to peaks of the read result 36 and generates a corresponding signal 38A, while the bottom hold circuit 32B tracks to bottoms of the read result 36 and generates a corresponding signal 38B. The converter 34 converts the signals 38A and 38B alternatively to digital signals. According to the digital signals corresponding to the signals 38A and 38B, the control module 30 can calculate a beta-parameter corresponding to the write-in power. Please refer to FIG. 3 (also FIG. 2), which illustrates an amplitude-versus-time diagram of each signal of the optical disk drive 20 in FIG. 2 when performing optimal power control, where the X-axis is time scale, and Y-axis is signal amplitudes. As FIG. 3 illustrates, the signal 38A provided by the peak hold circuit 32A tracks to peaks of the read result 36 (a dotted line shown in FIG. 3), while the signal 38B provided by the bottom hold circuit 32B tracks to bottoms of the read result 36. The level of the signal 38A provided by the converter 34 at time point tc1 is a level LP0, and at time point tc2 is a level LB0. Considering the levels LP0 and LB0, the beta-parameter of the read result 36 can be calculated.

As mentioned above, whether the write-in power deviates from the ideal value can be determined whether amplitudes of the read result is symmetric to the zero level L0. In the prior art optical disk drive 20, the peak and the bottom hold circuits 32A and 32B are to track peaks and bottoms of the read result 36 for calculating amplitude of the read result 36, and then calculate the beta-parameter.

Nevertheless, as FIG. 3 illustrates, the peak/bottom hold circuits track extreme values of signals with capacitors, where electric leakage is inevitable, such that both the peak and the bottom hold circuits cannot keep tracking the extreme values stably, which affects amplitude calculation of the read result 36. Take the signal 38A provided by the peak hold circuit 32A for example. When the peak hold circuit 32A starts tracking a peak level LP of the read result 36 at time point tc0, owing to electric leakage, the signal level of the signal 38A provided by the peak hold circuit 32A decreases gradually until at time point tc5, the signal level of the signal 38A is lower than the signal level of the read result 36. That is, the converter 34 samples a level LP0 of the signal 38A at time point tc1, but the level LP0 is not the real peak level LP of the read result. Similarly, the extreme level of the signal 38B provided by the bottom hold circuit 32B should be a level LB, but actually, the converter 34 samples a level LP0 at time point tc2 instead of the extreme level LB. In other words, the sampling values of the signals 38A and 38B provided by the converter 34 cannot indicate the amplitude of the read result 36. Besides, sampling results provided by the converter 34 at different time points also cannot indicate the amplitude of the read result because of the same reason. For example, sampling results provided by the converter 34 at time points tc3 and tc4 are different from those at time points tc1 and tc2, with the result that the corresponding beta-parameters are different. That is, the beta-parameters are not stable.

Because the converter 34 samples one of the signals 38A and 38B in each sampling, the read results 36 are the values in different sampling times. The read results 36 have different extreme values when data strings of the write-in data have different lengths. If the amplitude of the write-in data is determined correctly, write-in data of the same length should be compared by checking the extreme values of these write-in data. If the signal 38A is sampled by the converter 34 at the low extreme value of the short data stream, but the signal 38B is sampled at the bottom value of the long data stream, the beta-parameter will not be accurate.

Please refer to FIG. 4. FIG. 4 illustrates functional blocks of another well-known optical disk drive performing optimal power control. The optical disk drive 40 comprises a pick-up head 44, an access circuit 48, a control module 50, a high pass filter 42, a slicer 46, a charger 52A, a discharger 52B, a resistor R0, and a capacitor C0. The control module 50 controls the operation of the optical disk drive 40. When performing optimal power control, the control module 50 controls the access circuit 48 to transmit write-in data to the pick-up head 44. The pick-up head 44 writes the write-in data with a predetermined power onto the CD 26. The write-in data that was written in the CD 26 is sent back to the access circuit 48, which generates a read result 56A. The filter 42 high-pass filters the read result 56A and generates a filtered read result 56B. The slicer 46 slices the parts of the read data 56b which are higher or lower than a zero level L0 to sliced signals having fixed high and low levels, which are used to control the charger 52A and the discharger 52B. The charger 52A and the discharger 52B can be the controlled current sources. The charger 52A is able to charge the capacitor C0 through the resistor R0 to increase the voltage of the node N0. The discharger 52B is able to discharge the capacitor C0 through the resistor R0 to decrease the voltage of the node N0. Finally, the control module 50 calculates the beta-parameter according to the voltage of the node N0.

To further describe the principles of an optical disk drive performing optimal power control, please refer to FIG. 5 (as well as FIG. 4). FIG. 5 illustrates a waveform timing diagram of each relative signal of the optical disk drive 40 calculating the beta-parameter. The X-axis represents time, and the Y-axis represents the amplitude of each waveform. As described in FIG. 1, when write-in power deviates from the ideal value, the corresponding read result will deviate from the zero level. Accordingly, the periods between zero-crossing points do not represent the time period of the data streams of the same length. As for the case of the short data stream, the deviation from the zero level is more obvious. In FIG. 5, the read result 56A deviates from the zero level, especially the parts corresponding to short data streams between time intervals td1 to td4, and td6 to td8. The purpose of the high-pass filter 42 is to filter out DC deviation of the read result 56A from the zero level. For example, the high frequency part of the read result 56A between td1 to td4 and td6 to td8 deviates from the zero level L0, so two parts larger and smaller than the zero level L0 in the read result 56A have no symmetric amplitude. After high-pass filtering, the high frequency part of the read result 56B has a more symmetric waveform, which results from the reservation of high frequency signals and blocking of low frequency signals during filtering. Equivalently speaking, the high-pass filter 42 removes the deviation of the high frequency part of the read result 56A corresponding to short data streams from the zero level L0.

In contrast to the reservation of the high frequency part, the high-pass filter 42 adjusts the deviation of the low frequency part of the read result 56A to a larger degree. For example, between td4 and td5, the part of the read result 56A corresponding to a long data stream originally maintains two zero-crossing periods Tp0 and Tp1, but after being high-pass filtered, the read result 56B has similar DC shifting due to the effect of the reservation of high frequency part (the read result 56A in FIG. 5 is vertically shifted). Thus, the zero-crossing points, td4 and td5, of the read result 56B will be changed to td2 and td3. In other words, the deviation of the high frequency part (corresponding to the short data stream) of the read result 56A from the zero level L0 will be transformed to the change of the low frequency part (corresponding to the long data stream) of the read result 56B. Therefore, in the read result 56B, even for different data streams (especially the long data stream) with the same length, zero-crossing periods are different. The optical disc drive 40 of prior art calculates the beta-parameter according to the read result 56B to indicate if the write-in power deviates from the ideal value.

After the read result 56B is generated, the slicer 46 generates the sliced signal 58 according to the zero-crossing points of the read result 56B, letting the H level part of the sliced signal 58 correspond to the part of the result 56B which is higher than the zero level L0, and letting the L level part of the sliced signal 58 correspond to the part of the result 56B which is lower than the zero level L0. Therefore, the H level part and the L level part of the sliced signal 58 represent the zero-crossing periods of the read result 56B. According to the sliced signal 58 of the slicer 46, the charger 52a and the discharger 52B will charge and discharge the capacitor C0 in different times. The timing diagrams of 59A and 59B in FIG. 5 represent the charging time and the discharging time of the charger 52A and the discharger 52B, respectively. During the time when the sliced signal 58 maintains the level H, such as the time td2 to td3 and the time td4 to td5 in the timing diagram 59A, the charger 52A will charge the capacitor with a predetermined current. On the other hand, during the time when the sliced signal 58 maintains the level L, such as the time td1 to td2, the time td3 to td4 and the time td5 to td6 in the timing diagram 59B, the discharger 52B will discharge the capacitor with a predetermined current (usually the same as the predetermined charging current). Therefore, the charges stored in the capacitor C0 are relative to the difference of zero-crossing periods of the read signal 56B. As the capacitor C0 is charged and discharged according to the sliced signal 58, the accumulated charges in the capacitor C0 are equivalent to the difference between the period when the read result 56B is larger than the zero level L0 and the period when the read result 56B is smaller than the zero level L0.

When the write-in power is closer to the ideal value, the read results 56A and 56B should have almost perfect oscillation waveforms, and the period when the waveform is larger than the zero level L0 and the period when the waveform is lower than the zero level L0 should be almost equal, resulting in that the charges of the capacitor C0 are close to zero. In this situation, the write-in power is near the ideal value. Otherwise, if the write-in power further deviates from the ideal value, the read result 56A deviates from the zero level L0, as shown in FIG. 5. The deviation of read result 56A from the zero level L0 leads to the differences in the zero-crossing periods. The larger the differences in the zero-crossing periods, the more charges the capacitor C0 accumulates.

A disadvantage of the above prior art is that the accumulated charges in the capacitor C0 cannot sensitively and definitely indicate the difference of the zero-crossing periods of the read result 56B. Generally speaking, it is much easier for the deviation of the write-in power from the ideal value to result in shifting of the zero level in the high frequency part of the read result 56A. However, in the prior art technique shown in FIG. 4 and FIG. 5, both the high-frequency part and the low-frequency part of the read result 56B keep accumulating the difference of the zero-crossing periods. Because the purpose of high pass filtering is to reserve the AC (alternating current) part of the read result 56B, and an AC signal has equal positive and negative parts, the accumulation of the high-frequency zero-crossing periods and the low-frequency zero-crossing periods of the read result 56B after some time will cancel each other. In other words, the charges of the capacitor C0 are closer to zero after accumulation of the high-frequency zero-crossing periods and the low-frequency zero-crossing periods of the read result 56B even when the write-in power deviates from the ideal value, making the optimal control more difficult.

In summary, high-pass filtering transforms the deviation of the high-frequency part of the read result 56A to the differences of the zero-crossing periods of the low-frequency part of the read result 56B. If both high-frequency zero-crossing periods and the low-frequency zero-crossing periods are accumulated, the beta-parameter cannot definitely express the deviation of the write-in power.

SUMMARY OF INVENTION

It is therefore an objective of the claimed invention to provide a method for performing optimal power control of an optical disk drive in order to solve the above-mentioned problems.

According to the claimed invention, a method for performing optimal power control of an optical disk drive based on a beta-parameter for determining whether a default power is equal to an optimal write-in power for writing data onto an optical disk comprises: reading a write-in data from the optical disk and generating a corresponding read result after the write-in data is written onto the optical disk with the default power; setting a first level and a second level, wherein the first level is higher than the second level; and processing an evaluation step according to a portion of the read result whose level is higher than the first level and lower than the second level for accumulating the beta-parameter.

These and other objectives of the present invention will no doubt become obvious to those of ordinary skill in the art after reading the following detailed description of the preferred embodiment that is illustrated in the various figures and drawings.

DETAILED DESCRIPTION

Figure 6:
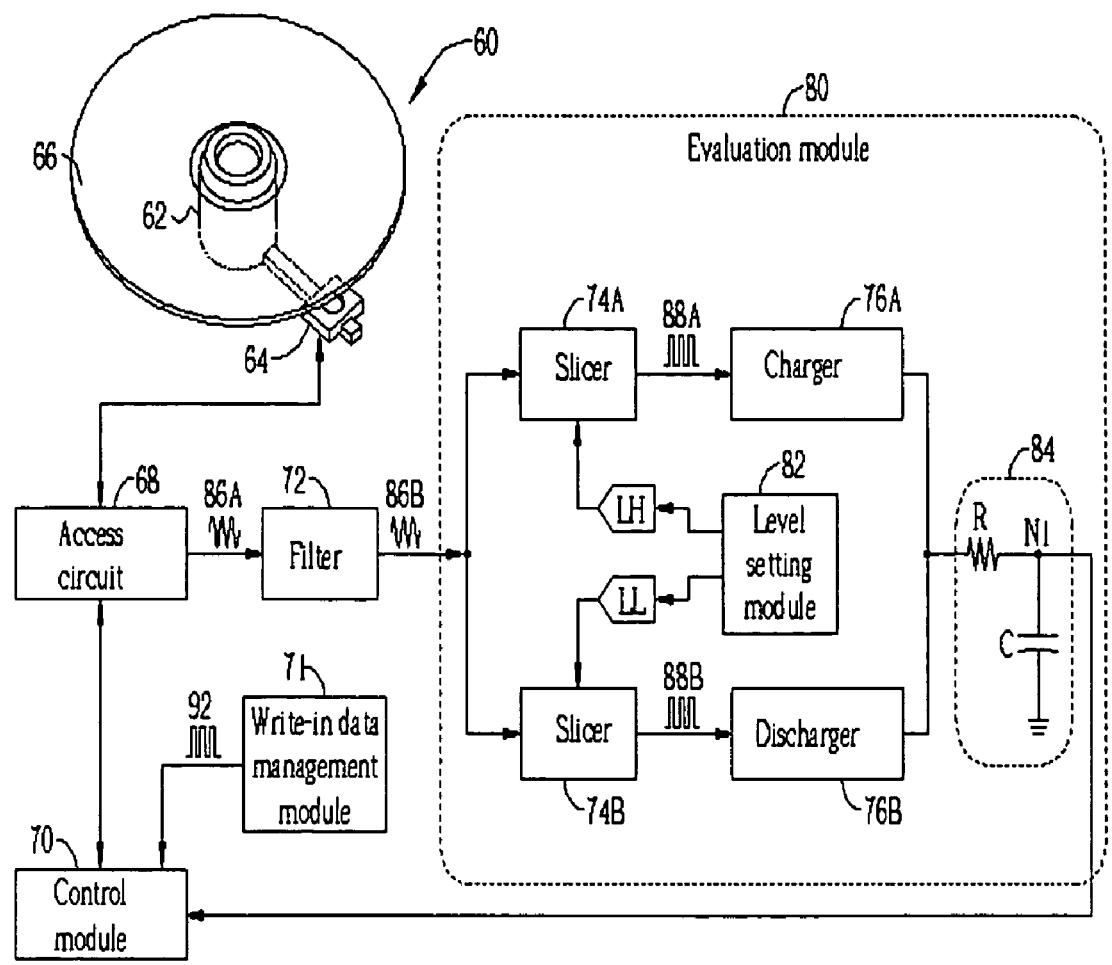
FIG. 6 illustrates a block diagram of an optical disk drive according to the present invention.

Please refer to FIG. 6, which illustrates a schematic diagram of an optical disk drive 60 according to the present invention. The optical disk drive 60 comprises a motor 62, a pick-up head 64, an access circuit 68, a control module 70, a high-pass filter 72, a write-in data arrangement module 71 and an evaluation module 80. The evaluation module 80 includes two slicers 74A and 74B, a charger 76A, a discharger 76B, a level setting module 82 and a storage unit 84. In FIG. 6, the storage unit 84 includes a resistor R a capacitor C. The motor 62 rotates an optical disk 66. The pick-up head 64 emits laser beams into the optical disk 66 and receives reflections for data access. The access circuit 68 connects to the high-pass filter 72. The control module 70 controls operations of the optical disk drive 60.

In the evaluation module 80, the level setting module 82 sets a high level LH and a low level LL. The slicer 74A slices the signals filtered after the filter 74 to generate a corresponding signal 88A according to the high level LH and controls the charger 76A to charge the storage unit 84 according to the corresponding signal 88A. Similarly, the slicer 74B slices the signals filtered after the filter 72 to generate a corresponding signal 88B according to the low level LL and controls the discharger 76B to discharge the storage unit 84 according to the corresponding signal 88B. In the preferred embodiment of the present invention, the high level LH and the low level LL have the same absolute value but opposite sign (LL=−LH).

The stored data in the storage unit 84 is represented by the charges of the capacitor C. The charger 76A increases the charges of the capacitor C or increases the data in the storage unit 84 when charging, while the discharger 76B decreases the charges of the capacitor C or decreases the data in the storage unit 84. The charge amount of the capacitor C is sent to the control module 70 with the voltage of the node N1. The write-in data arrangement module 71 is used to arrange the write-in data 92.

When the present invention optical disk drive 60 performs optimal power control, the control module 70 controls the pick-up head 64 to write the write-in data 92 provided by the write-in data arrangement module 71 onto the optical disk 66 with a default write-in power through the access circuit 68. Then, the pick-up head 64 reads the write-in data 92 from the optical disk 66, and generates a corresponding read result 86A through the access circuit 68 to the filter 72. The filter 72 outputs a read result 86B after high-pass filtering the read result 86A. The slicer 74A generates a sliced signal 88A according to whether the signal level of the read result 86B is larger than the high level LH. According the sliced signal 88A, the slicer 74A controls the charger 76A to charge the storage unit 84. Similarly, the slicer 74B generates a sliced signal 88B according to whether the signal level of the read result 86B is smaller than the low level LL to control the discharger 76B to discharge the storage unit 84. According to the stored data in the storage unit 84, the control module 70 obtains the beta-parameter.

Figure 7:
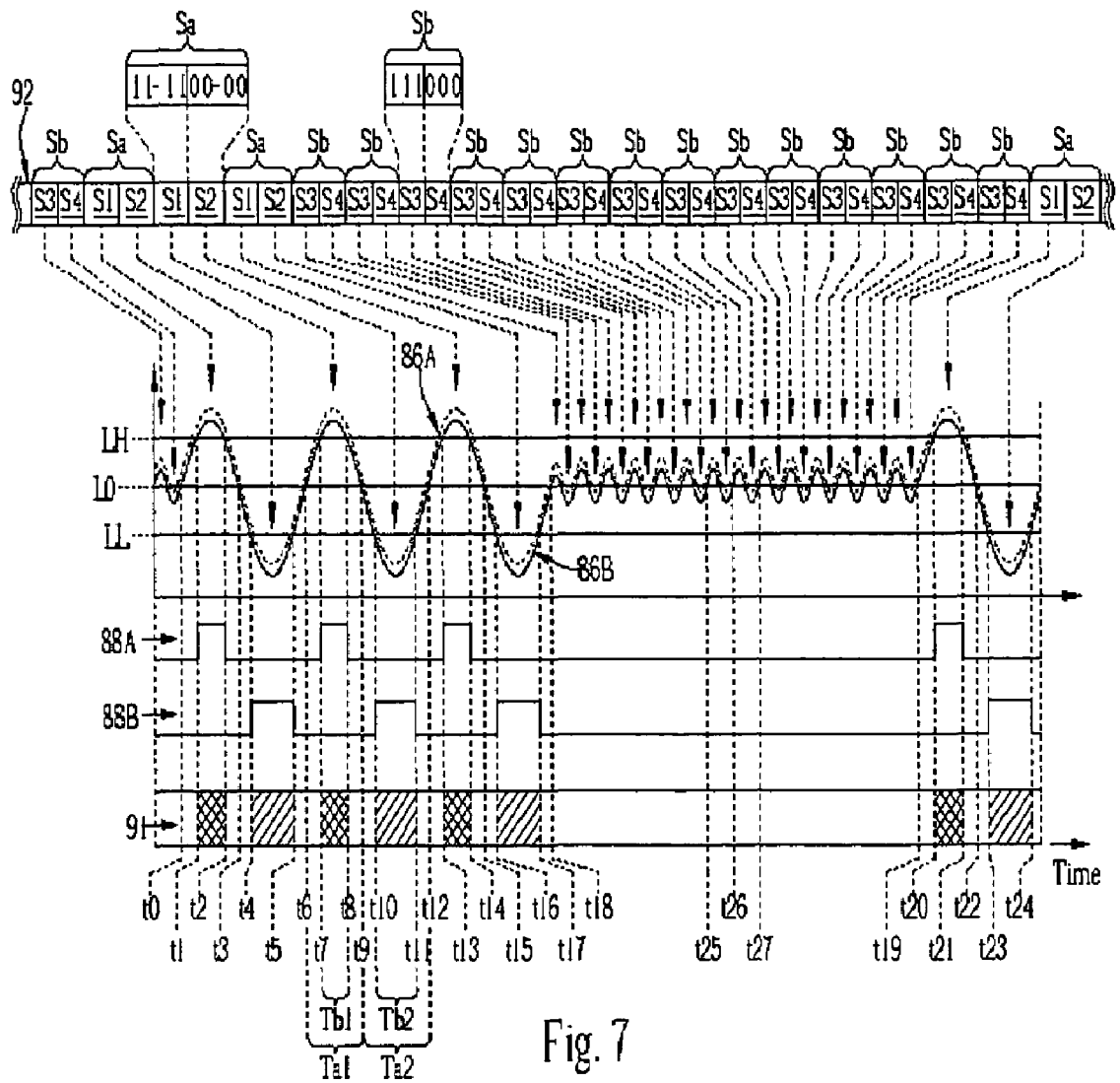
FIG. 7 illustrates a waveform-timing diagram of the optical disk drive in FIG. 6 while performing optimal power control.

Please refer to FIG. 7 (also FIG. 6), which illustrates a waveform-time diagram of the write-in data 92, the read results 86A and 86B (shown as a dotted line and a solid line respectively), the sliced signals 88A and 88B and related signals when the optical disk drive 60 of the present invention performs optimal power control. The X-axis in FIG. 7 represents time, while the Y-axis represents amplitudes of the read results 86A and 86B, and the sliced signals 88A and 88B. The write-in data 92 includes long sequences Sa and short sequences Sb, wherein each long sequence Sa includes a "1" long stream S1 and a "0" long stream S2, while each short sequence Sb includes a "1" short stream S3 and a "0" short stream S4. In addition, data to be written to the optical disk is coded to a plurality of streams with different lengths. In the DVD-R/RW specification, the longest stream has 14 bits (14T) with the same content, while the shortest stream includes three bits (3T) with the same content, so that the long streams S1 and S2 of the present invention have 14 "1" bits and 14 "0" bits respectively, while the short streams S3 and S4 of the present invention have three "1" bits and three "0" bits respectively. Similarly, in the specification of CD-R/RW, the longest and the shortest streams have 11 and three bits (also 11T and 3T) respectively, so that the long streams S1 and S2 of the present invention should be 11 bits, and the short streams S3 and S4 should be three bits.

Figure 1:
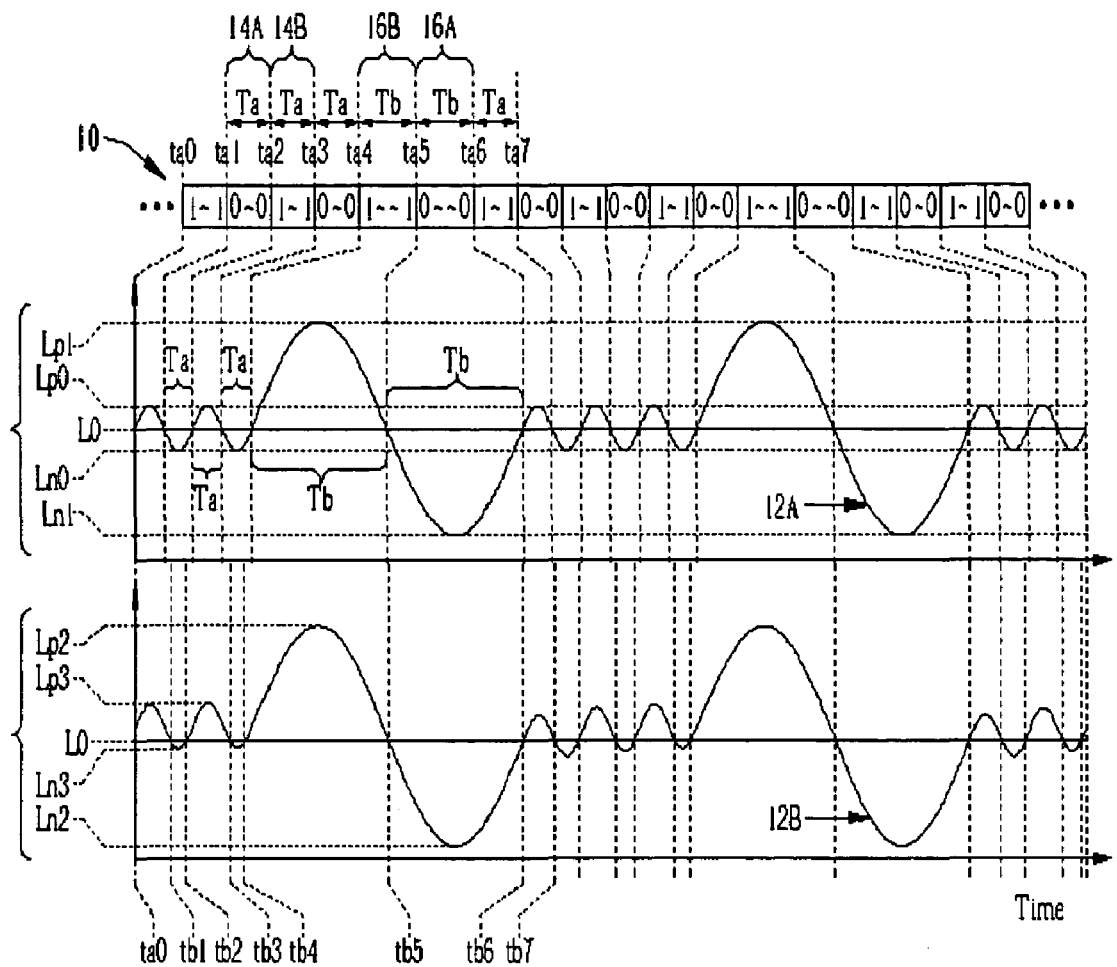
FIG. 1 illustrates a waveform-timing diagram of read result versus write-in power.
Figure 2:
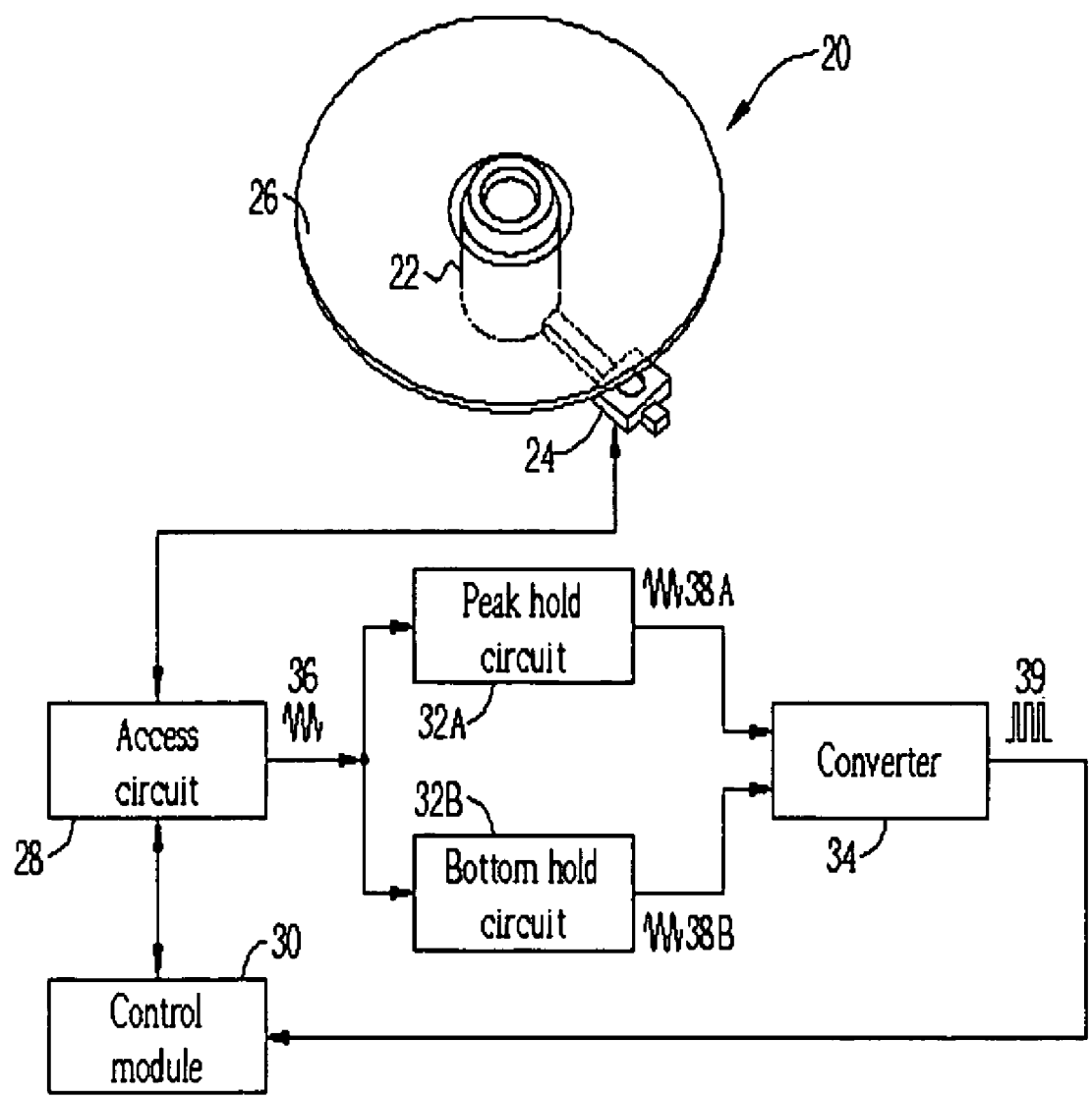
FIG. 2 illustrates a block diagram of an optical disk drive according to the prior art.
Figure 3:
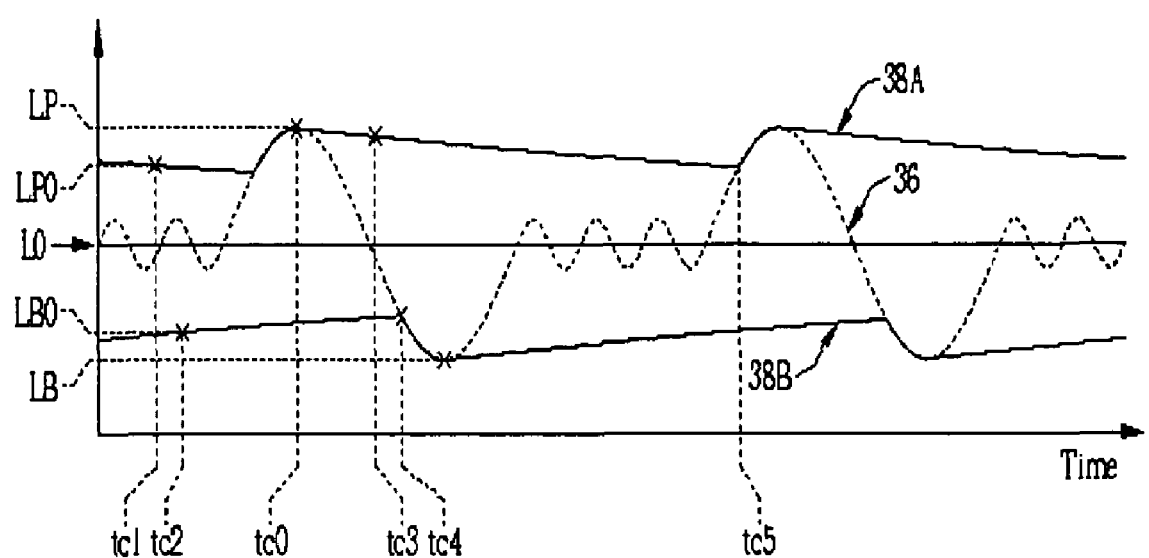
FIG. 3 illustrates a waveform-timing diagram of the optical disk drive in FIG. 2 while performing optimal power control.
Figure 4:
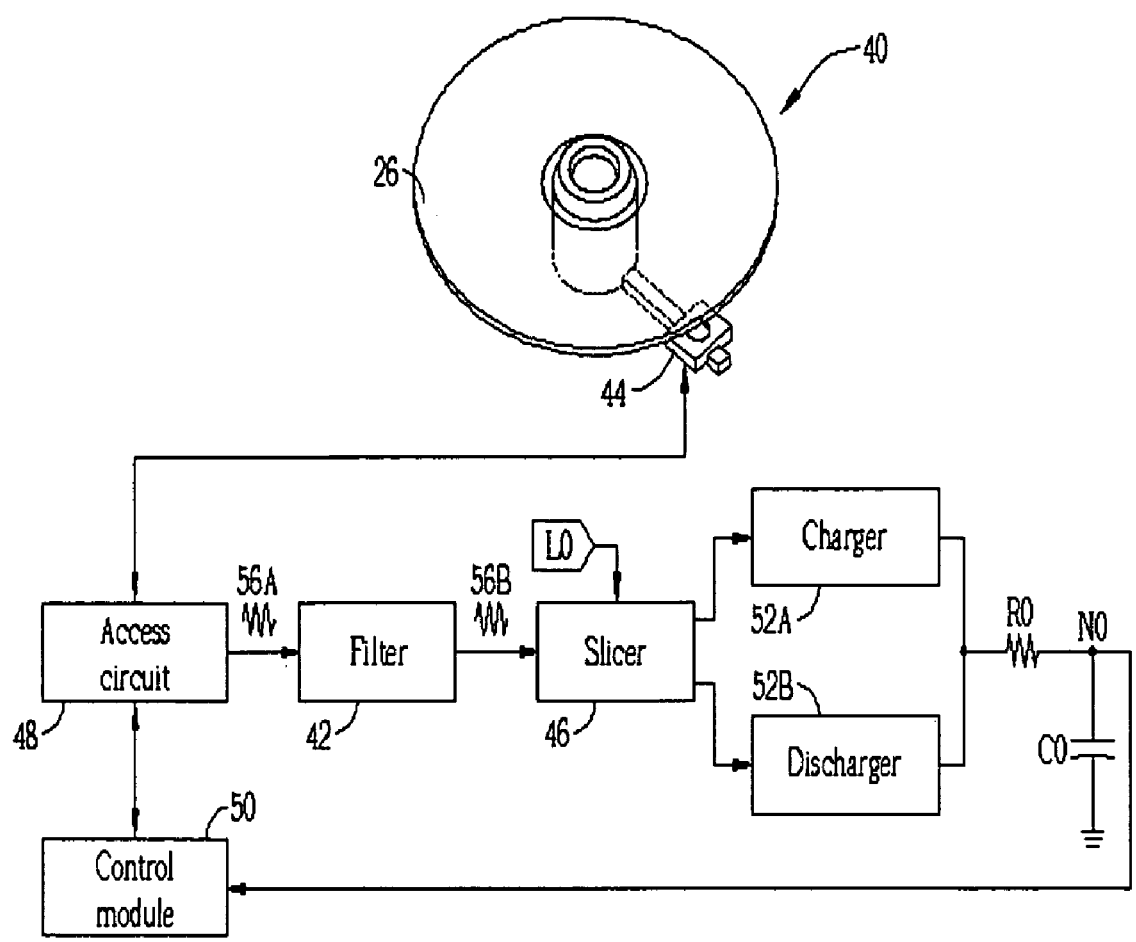
FIG. 4 illustrates a block diagram of another optical disk drive according to the prior art.
Figure 5:
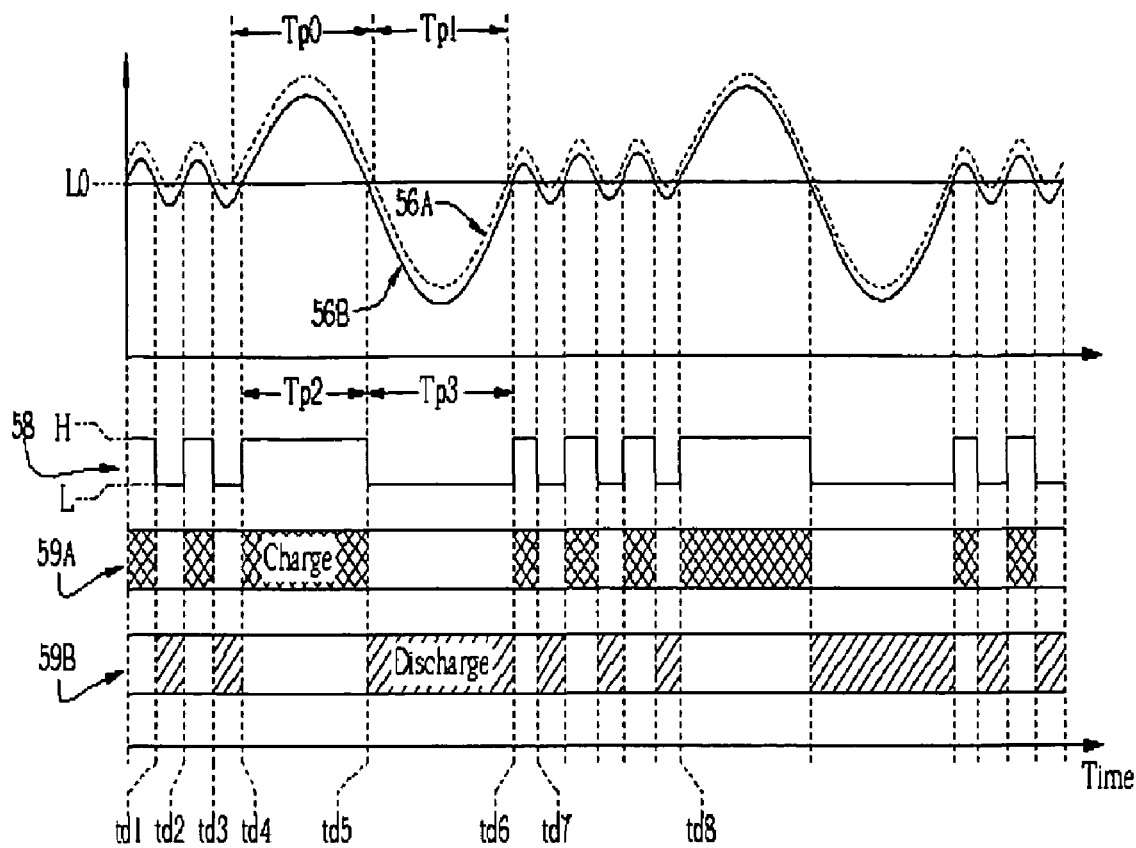
FIG. 5 illustrates a waveform-timing diagram of the optical disk drive in FIG. 4 while performing optimal power control.

As mentioned regarding FIG. 1, two streams in a data sequence with the same length and different contents correspond to a cycle of a read result. For example, in FIG. 7, the three long data sequences Sa formed by the long streams S1 and S2 of the write-in data 92 correspond to three low-frequency cycles of the read result 86A from time points t0 to t6, t6 to t12, and from time points t12 to t18, while each short sequence Sb corresponds to a high-frequency cycle of the read result 86A, such as the read result 86A from time points t25 to t26 and time points t26 to t27. Of course, when the write-in power deviates from the ideal power, the read result 86A deviates from the zero level L0, especially for the short sequences or the high-frequency cycles. After the read result 86A is high-pass filtered with the filter 72, deviation of the read result 86A from the zero level corresponds to the low-frequency portion of the read result 86B so that durations of the low-frequency portion of the read result 86B greater than the zero level are different from durations of the low-frequency portion of the read result 86B smaller than the zero level.

After the slicer 74 slices the read signal 86B into the sliced signal 88A, the level H portions of the sliced signal 88A correspond to the portions of the read result 86B greater than the level LH, while the level L portions of the slice signal 88 correspond to the portions of the read result 86B smaller than the level LH. For example, as shown in FIG. 7, the levels of the read result 86B during time points t1 to t2 and time points t7 to t8 are higher than the level LH, so the sliced signal 88A changes from the level L to the level H during this time. Similarly, for the slicer 74B the levels of the read result 86B during time points t4 to t5 and time points t10 to t11 are lower than the level LH, so the sliced signal 88B changes from the level L to the level H.

The portions of the read result corresponding to long streams not only have low frequency but also have larger amplitude. In contrast, the portions corresponding to short streams have smaller amplitude. In fact, in the specification of a rewritable CD, the amplitude of the waveforms corresponding to the short stream 3T is usually 15% of that corresponding to the long stream 14T. The present invention utilizing the above principles, the slicers 74A and 74B in the invention slice the read result 86B according to the levels LH and LL. Therefore, the sliced signal 88A and 88B show the parts of the read result having the larger amplitude, or the low frequency parts of the read result 86B which correspond to the long streams. Notice that to achieve the above effects, the level setting module 82 should carefully set the levels LH and LL. The absolute values of the level LH and LL range between a typical value of the amplitude of the low frequency part and a typical value of the amplitude of the high frequency part.

As shown in FIG. 7, the difference of the zero-crossing periods of the read signal 86B also causes the difference of the durations in which the read signal 86B is higher than the level LH and the durations in which the read signal 86B is smaller than the level LL. For example, during the time points t6 to t9, the portion of the read signal 86B larger than the zero level L0 maintains the zero-crossing period Ta1, and during the time points t9 to t12, the portion of the read signal 86B smaller than the zero level L0 maintains the zero-crossing period Ta2. During the time points t6 to t12, the deviation of the zero level of read result 86B makes the total signal shift downward, so the positive portion and the negative portion of the zero-crossing periods are unbalanced and Ta2 is longer than Ta1. Meanwhile, the down shifting of the read signal 86B results during the duration when the read signal 86B is higher than the level LH is shorter than the duration when the read signal 86B is lower than the level LL. If the down shifting of the read signal 86B is larger, the difference between zero-crossing durations Ta2 and Ta1 is larger.

In other words, for the read result 86B, the portions exceeding the level LH and the level LL not only represent the read signal 86B corresponding to the low frequency part of long streams and durations when the signal exceeds the levels LH and LL, but also represent the length of the zero-crossing periods of the low frequency parts which are larger or smaller than the zero level L0 in the read signal 86B. Therefore, the present invention uses the difference between the durations when the result signal 86B exceeds the levels LH and LL to estimate the beta-parameter of the write-in result. In comparison, the high-frequency part of the read result 86B completely ranges between the levels LH and LL. Equivalently speaking, the high frequency part of the read result 86B is filtered out. Therefore, the present invention obtains a more definite beta-parameter according to only the low-frequency part of the read result.

To implement the above principle, the charger 76A charges the storage unit 84 when the sliced signal 88A maintains the level H. The discharger 76B discharges the storage unit 84 when the sliced signal 88B maintains the level H. In FIG. 7, the timing diagram 91 represents the charger 76A and the discharger 76B charging or discharging the capacitor C. For example, the read result 86B is larger than the high level LH during the time points t6 to t12, and the sliced signal 88A drives the charger 76A to charge with the voltage H, illustrated as the cross-hatched durations in the timing diagram 91. The increased charges in the capacitor C are proportional to Tb1. In contrast, the read result 86B is lower than the low level LL during the time points t10 to t11, and the sliced signal 88B drives the discharger 76B to discharge with the voltage H, as illustrated by the single-hatched durations. During the times t6 and t12, the increased charges in the capacitor C are proportional to (Tb1–Tb2), corresponding to the difference of the zero-crossing periods of the read signal 86B. Notice that during time points t18 to t19, the capacitor C will not be charged or discharged due to the small amplitude of the high part of the read result 86B which does not exceed the level LH and LL. Therefore, the accumulated charge in the capacitor C can reflect the difference of the zero-crossing periods of the low frequency part of the read result 86B, and the write-in optimal power control is performed more accurately accordingly.

Figure 8:
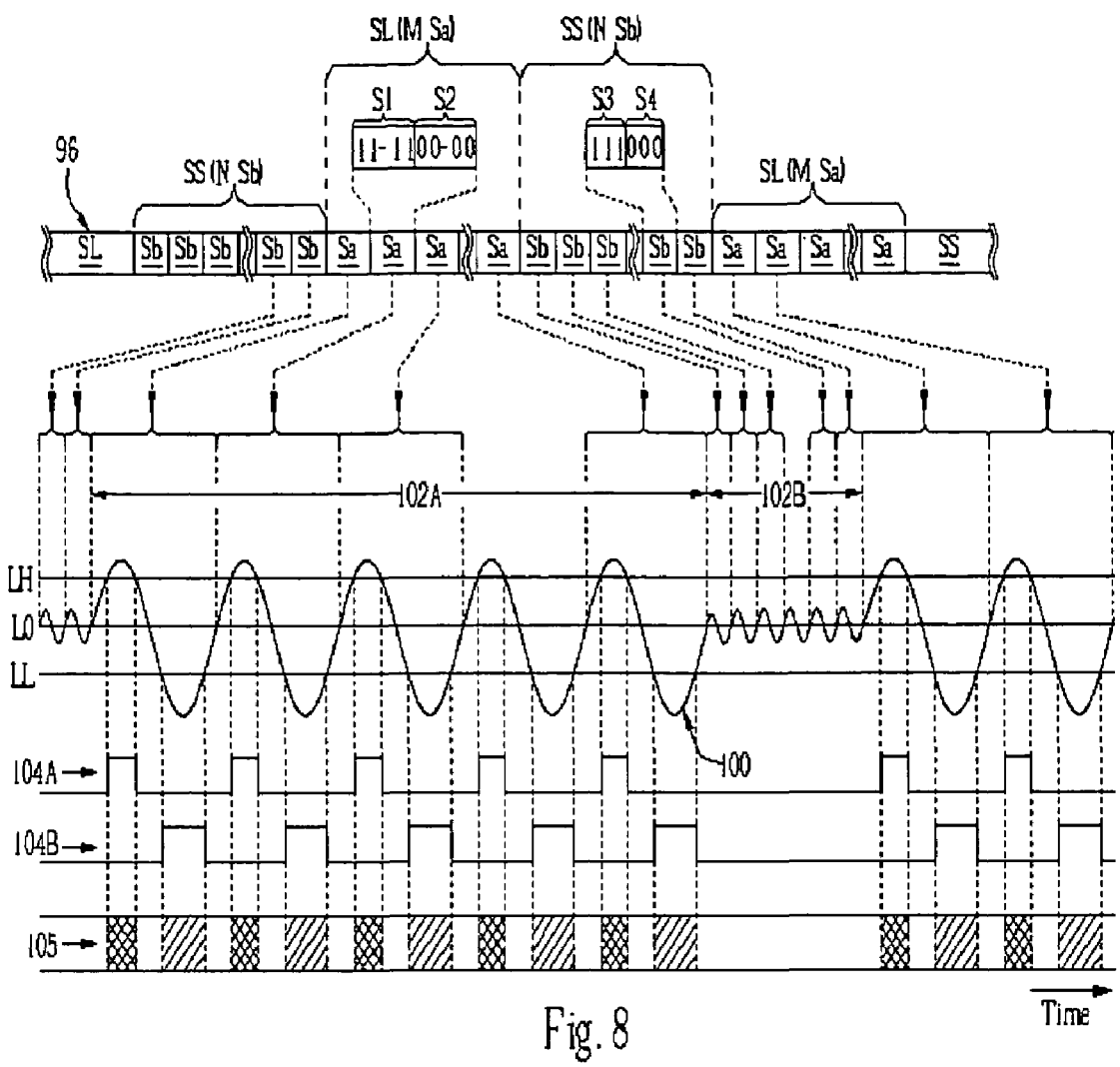
FIG. 8 illustrates a waveform-timing diagram of a write-in data and related signals in another embodiment of the present invention.

In the preferred embodiment of the present invention, the write data can include a plurality of connected long data sequences, and a plurality of connected short data sequences. As for this situation, please refer to FIG. 8 (also FIG. 6 and FIG. 7). FIG. 8 illustrates a data format of a write-in data 96 and a waveform-timing diagram of a (high-pass filtered) read result 100, sliced signals 104A and 104B, and a driving sequence 105 representing the charge or discharge of the capacitor C by the charger 76A or the charger 76B according to the present invention. The X-axis is time scale. In the driving sequence 105, the cross-hatched part represents the charging period and the single-hatched part represents the discharging period. The write-in data 96 includes a plurality of blocks SL and SS; each block SL includes M long sequences Sa, while each block SS includes N short the sequences Sb; each long sequence Sa includes "1" and "0" long streams S1 and S2 with the same length (such as a 14-bit long stream), while each short sequence Sb includes "1" and "0" short streams S3 and S4 with the same length (such as a 3-bit short stream). Portions of the read result corresponding to the long sequences have greater amplitude and period than the short sequences, so that the block SL corresponds to a low-frequency portion of the read result 100, or a read signal 102A, while the block SS corresponds to a read signal 102B.

In the block SL and SS, the number of the long data sequence is represented by M, and the number of the short data sequence is represented by N. A proportion of M to N is for adjusting the effect of the high-pass filter filtering an original read signal. For example, if the proportion of M to N is an inverse proportion of number of bits of the long stream to number of bits of the short stream (that is, M:N=3:14), the duration of the block SL is equal to the duration of the block SS. After high-pass filtering, the deviation of zero level in high-frequency portions of the original read result corresponding to the block SS causes the same deviation of zero level in low-frequency portions of the filtered read result. If the proportion of M to N is decreased (such as 3:17), the duration of the block SL is greater than the duration of the block SS while the deviation of zero level in low-frequency portions of the filtered read result becomes more serious. Accordingly, the durations when the read result 100 exceeds the level LH and LL have more differences.

In implementing the evaluation module 80, each circuit, the filter 72 and the control module 70 of the evaluation module 80 can be integrated by a chip in hardware or by program codes in firmware. Besides the charger, discharger and the storage unit of the present invention being implemented with a fixed current source and a capacitor, the present invention can use counters to implement the charger and the discharger and use a register to implement the storage unit. In this case, the counter counts the time that the sliced signal maintains the levels H and L and the counted result is stored in the storage unit. The combination of the count of the H level duration and the count of the L level duration represents the difference of the time when the read result exceeds the H and L levels. For example, in FIG. 7 suppose that the optical disc drive 60 uses a high-frequency clock whose period is 0.01T (1T is the time of one bit in the read data). If the duration Tb1 between t7 to t8 is 3.3T, the counter will increase 330 counts during the period (3.3T/0.01T). Comparatively, if the duration Tb2 between t10 to t11 is 4.2T, the counter will decrease 440 counts during the period. Therefore, the accumulated counts can be used to calculate the write-in result.

In conclusion, to perform write-in power control in the present invention is to calculate the write-in result parameter, beta-parameter being according to the difference of the durations when the high-pass filtered read result exceeds a high level and a low level. Therefore, the present invention accumulates the data of the storage unit 84 according to only a low-frequency part of the read result so that the present invention obtains a more accurate beta-parameter, and reflects the deviation of the write-in power more definitely by removing the effect of a high-frequency part of the read result.

In the prior art, it is difficult to choose the proper sampling time when calculating the beta-parameter by using the extreme value of the read result. On the other hand, using accumulation of both high frequency zero-crossing periods and low frequency zero-crossing periods to calculate the beta-parameter cannot definitely express the deviation of the write-in power. In comparison with the prior art, the present invention can determine a portion of the high-pass filtered read result corresponding to the long stream, and calculate a beta-parameter based on that portion, so that the beta-parameter can better correspond to the write-in power provided by the optical disk drive. Finally, the optical disk drive can write onto an optical disk with a preferred power to perform optimal power control.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for performing optimal power control of an optical disk drive based on a beta-parameter for determining whether a default power is equal to an optimal write-in power for writing data onto an optical disk, the method comprising:
   reading a write-in data from the optical disk and generating a corresponding read result after the write-in data is written onto the optical disk with the default power;
   setting a first level and a second level, wherein the first level is higher than the second level; and
   processing an evaluation step according to a portion of the read result whose level is higher than the first level and lower than the second level for accumulating the beta-parameter.

2. The method of claim 1 wherein when processing the evaluation step, accumulating the beta-parameter is not according to the portion of the read result whose levels are between the first level and the second level.

3. The method of claim 1 further comprising: high-pass filtering the read result before processing the evaluation step so that the evaluation step is according to the filtered read result.

4. The method of claim 1 further comprising:
generating a first sliced signal according to the first level, wherein a portion of the first sliced signal belonging to a first digital level corresponds to a portion of the read result whose level is higher than the first level, and a portion of the first sliced signal belonging to a second digital level corresponds to a portion of the read result whose level is lower than the first level; and
increasing the beta-parameter when the first sliced signal maintains the first digital level, and stopping increasing the beta-parameter when the first sliced signal maintains the second digital level.

5. The method of claim 1 wherein processing the evaluation step further comprises:
generating a second sliced signal according to the second level, wherein a portion of the second sliced signal belonging to the first digital level corresponds to a portion of the read result whose level is lower than the second level, and a portion of the second sliced signal belonging to the second digital level corresponds to a portion of the read result whose level is higher than the second level; and
increasing the beta-parameter when the second sliced signal maintains the first digital level, and stopping decreasing the beta-parameter when the second sliced signal maintains the second digital level.

6. The method of claim 1 wherein the write-in data comprises at least a first data sequence and at least a second data sequence, and the read result comprises a first read sub-result and a second read sub-result corresponding to the first data sequence and the second data sequence respectively, the amplitude of the first read sub-result being larger than that of the second read sub-result.

7. The method of claim 6 wherein the first level is higher than the highest level of the second read sub-result and lower than the highest level of the first read sub-result.

8. The method of claim 6 wherein the second level is lower than the lowest level of the second read sub-result and higher than the lowest level of the second read sub-result.

9. The method of claim 6 wherein the first data sequence comprises at least a first stream, each first stream comprising a predetermined number of bits of data with the same content, the second data sequence comprises at least a second stream, each second stream comprising a predetermined number of bits of data with the same content, the number of the bits of data in the first stream being larger than that in the second stream.

10. An optical disk drive comprising:
an access circuit for writing a write-in data onto an optical disk with a default power, the access circuit capable of reading the written write-in data on the optical disk and generating a corresponding read result;
an evaluation module electrically connected to the access circuit comprising:
a first slicer for detecting a portion of the read result higher than a first level; and
a second slicer for detecting a portion of the read result lower than a second level;
wherein the first level is higher than the second level; and the evaluation module accumulates a beta-parameter according to the detected results of the first slicer and the second slicer; and
a control module electrically connected to the evaluation module for controlling operation of the optical disk drive, the control module capable of determining if the default write-in power is the preferred power according to the beta-parameter.

11. The optical disk drive of claim 10 wherein the evaluation module stops accumulating the beta-parameter according to a portion of the read result ranging between the first level and the second level.

12. The optical disk drive of claim 10 further comprising a high-pass filter between the access circuit and the evaluation module for high-pass filtering the read result and transmitting the filtered read result to the evaluation module.

13. The optical disk drive of claim 10 wherein the evaluation module further comprises a storage unit electrically connected to the first slicer and the second slicer for storing the beta-parameter.

14. The optical disk drive of claim 13 wherein the first slicer generates a first sliced signal according to the first level, so that a portion of the first sliced signal belonging to a first digital level corresponds to a portion of the read result whose level is higher than the first level, and a portion of the first sliced signal belonging to a second digital level corresponds to a portion of the read result whose level is lower than the first level, the evaluation module further comprising:
a charger, electrically connected between the first slicer and the storage unit, for increasing the beta-parameter when the first sliced signal maintains the first digital level, and stopping decreasing the beta-parameter when the first sliced signal maintains the second digital level.

15. The optical disk drive of claim 13 wherein the second slicer generates a second sliced signal according to the second level so that a portion of the second sliced signal belonging to a first digital level corresponds to a portion of the read result whose level is lower than the second level, and a portion of the second sliced signal belonging to a second digital level corresponds to a portion of the read result whose level is lower than the second level, the evaluation module further comprising:
a discharger, electrically connected between the second slicer and the storage unit, for decreasing the beta-parameter when the second sliced signal maintains the first digital level, and stopping decreasing the beta-parameter when the second sliced signal maintains the second digital level.

16. The optical disk drive of claim 10 wherein the write-in data comprises at least a first data sequence and at least a second data sequence, the read result comprising a first read sub-result and a second read sub-result corresponding to the first data sequence and the second data sequence respectively, the amplitude of the first read sub-result being larger than that of the second read sub-result.

17. The optical disk drive of claim 16 wherein the first level is higher than the highest level of the second read sub-result and lower than the highest level of the first read sub-result.

18. The optical disk drive of claim 16 wherein the second level is lower than the lowest level of the second read sub-result and higher than the lowest level of the second read sub-result.

19. The optical disk drive of claim 16 wherein the first data sequence comprises at least a first stream, each first stream comprising a predetermined number of bits of data with the same content, the second data sequence comprises at least a second stream, each second stream comprising a predetermined number of bits of data with the same content, the number of the bits of data in the first stream being larger than that in the second stream.

* * * * *